US008255023B2

(12) United States Patent
Schlenga et al.

(10) Patent No.: US 8,255,023 B2
(45) Date of Patent: Aug. 28, 2012

(54) CRYOSTAT HAVING A MAGNET COIL SYSTEM, WHICH COMPRISES AN LTS SECTION AND AN ENCAPSULATED HTS SECTION

(75) Inventors: Klaus Schlenga, Linkenheim (DE); Marion Klaeser, Karlsruhe (DE); Thomas Arndt, Hanau (DE)

(73) Assignees: Bruker Biospin GmbH, Rheinstetten (DE); Forschungszentrum Karlsruhe GmbH, Karlsruhe (DE)

( * ) Notice: Subject to any disclaimer, the term of this patent is extended or adjusted under 35 U.S.C. 154(b) by 970 days.

(21) Appl. No.: 12/225,192

(22) PCT Filed: Mar. 7, 2007

(86) PCT No.: PCT/EP2007/001926
§ 371 (c)(1),
(2), (4) Date: Sep. 16, 2008

(87) PCT Pub. No.: WO2007/107240
PCT Pub. Date: Sep. 27, 2007

(65) Prior Publication Data
US 2009/0233797 A1    Sep. 17, 2009

(30) Foreign Application Priority Data
Mar. 18, 2006   (DE) .................. 10 2006 012 508

(51) Int. Cl.
*H01F 6/04* (2006.01)
*H01F 6/06* (2006.01)
*G01V 3/00* (2006.01)

(52) U.S. Cl. ........ 505/163; 505/210; 335/216; 335/296; 324/318; 62/51.1

(58) Field of Classification Search .............. 505/163, 505/211, 230, 430, 705, 844, 879, 885, 892, 505/951; 335/216–217, 296–301; 324/318–320; 62/51.1
See application file for complete search history.

(56) References Cited

U.S. PATENT DOCUMENTS
5,150,578 A * 9/1992 Oota et al. .................. 62/47.1
(Continued)

FOREIGN PATENT DOCUMENTS
DE    201 13 547    3/2002
(Continued)

OTHER PUBLICATIONS

Kiyoshi et al, "Superconducting Inserts in High-Field Solenoids", IEEE Transactions on Applied Superconductivity, US, vol. 12, No. 1, Mar. 2002, pp. 470-475.*

(Continued)

*Primary Examiner* — Stanley Silverman
*Assistant Examiner* — Kallambella Vijayakumar
(74) *Attorney, Agent, or Firm* — Paul Vincent

(57) ABSTRACT

A cryostat (1) with a magnet coil system including superconductors for the production of a magnet field $B_0$ in a measuring volume (3) has a plurality of radially nested solenoid-shaped coil sections (4, 5, 6) and which are electrically connected in series, at least one of which being an LTS section (5, 6) with a conventional low temperature superconductor (LTS) and at least one of which being an HTS section (4) including a high temperature superconductor (HTS), wherein the magnet coil system is located in a helium tank (9) of the cryostat (1) along with liquid helium at a helium temperature $T_L$. The apparatus is characterized in that a chamber (11) is provided within which the HTS sections (4) are held having an internal portion with a sufficiently low pressure such that helium located therein at a temperature of $T_L$ is gaseous. The cryostat in accordance with the invention can be utilized to maintain HTS coil sections over a long period of time in a reliable fashion.

20 Claims, 3 Drawing Sheets

U.S. PATENT DOCUMENTS 5,829,270 A * 11/1998 Mikheev .................. 62/610
2006/0066429 A1 * 3/2006 Kasten .................. 335/296

FOREIGN PATENT DOCUMENTS

| DE | 10 2004 007340 | 9/2005 |
| EP | 1 195 777 | 4/2002 |
| WO | WO 98/09004 | 3/1998 |
| WO | WO 01/08234 | 2/2001 |

OTHER PUBLICATIONS

Tsukasa Kiyoshi et al. "Development of 1 GHz Superconducting NMR Magnet at ML/NRIM", IEEE Transactions on Applied Superconductivity, IEEE Service Center, Los Alamitos, CA, US, vol. 9, No. 2, Jun. 1999.

Tsukasa Kiyoshi et al. "Superconducting Inserts in High-Field Solenoids", IEEE Transactions on Applied Superconductivity, IEEE Service Center, Los Alamitos, CA, US, vol. 12, No. 1, Mar. 2002.

Tsukasa Kiyoshi et al. "Superconducting Inserts in High-Field Solenoids". IEEE Transactions on Applied Superconductivity, IEEE Service Center, Los Alamitos, CA, US, vol. 12, No. 1, Mar. 2002.

Tsukasa Kiyoshi et al. "Development of 1 GHz Superconducting NMR Magnet at TML/NRIM". IEEE Transactions on Applied Superconductivity, IEEE Service Center, Los Alamitos, CA, US, vol. 9, No. 2, Jun. 1999.

* cited by examiner

CRYOSTAT HAVING A MAGNET COIL SYSTEM, WHICH COMPRISES AN LTS SECTION AND AN ENCAPSULATED HTS SECTION

This application is the national stage of PCT/EP2007/001926 filed on Mar. 7, 2007 and also claims Paris Convention priority to DE 10 2006 012 508.8 filed Mar. 18, 2006.

BACKGROUND OF THE INVENTION

The invention concerns a cryostat having a magnetic coil system including superconducting materials for generation of a magnetic field $B_0$ within a measurement volume, the magnet system having a plurality of radially nested solenoid-shaped coil sections connected in series at least one of which is an LTS section of a conventional low temperature superconductor (LTS) and with at least one HTS section of a high temperature superconductor (HTS), wherein the magnet coil system is located in a helium tank of the cryostat having liquid helium at a helium temperature $T_L$.

Cryostats of this kind are e.g. disclosed in DE 10 2004 007 340 A1.

By way of example, nuclear magnetic resonance systems, in particular spectrometers, require very strong, homogenous and stable magnetic fields. The stronger the magnetic field, the better the signal to noise ratio as well as the spectral resolution of the NMR measurement.

Superconducting magnet coil systems are used to produce strong magnetic fields. Magnetic coil systems having solenoid-shaped coil sections are widely used which are nested within each other and operated in series. Superconductors can carry electrical current without losses. The superconducting condition is established below the material-dependent transition temperature. Conventional low temperature superconductors (LTS) are normally utilized for the superconducting material. These metallic alloys, such as NbTi and $Nb_3S$, are relatively easy to process and are reliable in application. An LTS coil-portion conductor usually comprises a normally conducting metallic matrix (copper) in which superconducting filaments are embedded and which, during normal operation, completely carry the current. In the case of NbTi, these are usually several tens or hundreds of filaments; in the case of $Nb_3Sn$, the filament number could be more than one hundred thousand. Although the internal construction of the conductor is actually somewhat more complex, this is irrelevant within the present context.

The coil sections are cooled with liquid helium within a cryostat in order to cool the superconducting portions below the transition temperature. The superconducting coil sections are thereby at least partially immersed in the liquid helium.

In order to further increase the magnetic field strength of the magnetic coil system it is desirable to also utilize a high temperature superconductor (HTS). For a given temperature, conductors, which include HTS, can carry much more current and thereby achieve higher magnetic field strengths than those with LTS. HTS materials are thereby appropriate for use in the inner most coil sections of a magnetic coil system.

HTS or ceramic superconductors are currently primarily made from bismuth conductors with HTS filaments within a silver matrix. The conductors are usually stripe or bandshaped.

Coil sections made from HTS have turned out to be unreliable and susceptible to short lifetimes, particularly in undercooled helium. Investigation of defective HTS portions has shown that the HTS material is split open, thereby destroying the current carrying capability of the HTS conductor. This effect, which is also known in other context, is occasionally referred to as "ballooning".

It is accordingly the purpose of the present invention to present a cryostat in which HTS coil portions enjoy a long lifetime and can be utilized in a reliable manner, in particular, without ballooning.

SUMMARY OF THE INVENTION

This purpose is achieved by a cryostat of the above-mentioned kind in that the HTS section is surrounded by a chamber having an internal pressure which is sufficiently low that helium located therein at temperature $T_L$ remains gaseous.

In accordance with the present invention, it has been discovered that the ballooning is caused by helium, which expands or evaporates within the HTS material. As is well known, helium liquefies at a pressure of 1 bar below approximately 4.2 K. HTS material is ceramic and therefore has a certain porosity. Liquid helium can pass through the pores into the inner portions of the HTS material. In particular, in a superfluid state of helium, which obtains below the λ point temperature of approximately 2.2 K, helium can pass through the smallest of gaps. In the event that subsequently heats beyond the evaporation point, it then expands rapidly in volume during evaporation. If the warming occurs too rapidly, the evaporating helium cannot escape quickly enough from the porous material and a substantial amount of pressure is built up within the pores of the HTS. Since the HTS material is ceramic and relatively brittle, the HTS can be explode in consequence of this pressure.

All of the above can be prevented with the cryostat in accordance with the invention. The HTS section or the HTS sections of the magnet coil system and thereby all HTS material is disposed in a separate chamber within the helium tank. If helium is present in this chamber, it is gaseous, not liquid. This is achieved in that the amount of the helium in the chamber is sufficiently small that this helium remains in the gaseous state at temperatures corresponding to $T_L$ of the liquid helium in the helium tank. The chamber and the possible helium contained therein as well as the HTS coil sections are preferentially kept at temperature $T_L$. It is, however, also possible within the context of the invention, for the inner chamber to be kept at a temperature $T_K$ which is greater than $T_L$ through use of appropriate heating means, in particular, wherein $T_K$>2.2 K (λ point temperature). Since the HTS material of the HTS sections in the chamber does not come in contact with liquid helium, liquid helium cannot seep into the inner parts of the HTS material where it then subsequently evaporates. The ballooning effect of the HTS is therefore prevented.

The chamber is properly sealed with respect to liquid and gaseous helium, in particular with respect to the surrounding helium tank. The wall materials of the chamber can be made from a suitable material such as metal, metal alloys, or stainless steel. If the sealing is complete, there in no need for maintenance of the chamber during operation of the cryostat. By way of example, the chamber can be filled with gaseous helium at 1 bar prior to operation of the cryostat, closed and then cooled to a temperature $T_L$<4 K e.g. 3 K. In consequence thereof, the pressure of the helium in the chamber is reduced to approximately 10 mbar and the helium in the chamber remains completely gaseous. The conductivity of the chamber containing the helium is sufficient to cool the HTS sections in the chamber. The cooling power is typically converted or transferred by means of the chamber wall which separates the chamber from the helium tank and is therefore at a temperature $T_L$. Alternatively, it is possible to evacuate the chamber, wherein the cooling power is transferred from the wall of the chamber to the HTS section by means of thermal contacts e.g. made from copper.

In an advantageous embodiment of the cryostat in accordance with the invention, the temperature of the liquid helium $T_L$<4 K, preferentially <2.5 K, in particular <2.2 K. At this low temperature, the danger of ballooning is particularly high without the measures in accordance with the invention so that the advantages of the invention are particularly great. The low temperatures allow higher magnetic field strengths $B_0$.

In a preferred embodiment of the cryostat in accordance with the invention, the chamber also surrounds superconducting leads connected to at least one HTS section, at least to the extent that these leads contain HTS material. In this way, all the HTS material, including joints, is protected from liquid helium.

In a highly preferred embodiment, the chamber has a pressure measuring device, in particular, a thermothron. The pressure measuring device permits regulation of the pressure in the chamber. In particular, helium gas is pumped out of the chamber in the event of an increased pressure in the chamber which could cause liquefying thereof. In the event of an unexpected increase in pressure, it is thereby possible to immediately effect repairs.

In another particularly highly preferred embodiment, a conduit is provided for connecting the chamber to a pumping device. The conduit can be used in conjunction with the pumping device to monitor the helium pressure in the chamber and reduce same if necessary. Small leaks in the wall of the chamber through which the helium can pass from the helium tank into the chamber can thereby be compensated for. In particular, small leaks can thereby be compensated for during continuous operation. A metallic capillary having an inner diameter of one millimeter is suitable for the conduit. A rotation pump can be utilized for the pumping device.

In an additional advantageous embodiment of the invention, the chamber is strengthened with respect to quenches, in particular, in that the chamber can withstand an external pressure of 5 bar. In the event of a quench (sudden breakdown in superconductivity), the inner portion of a chamber should not come in contact with liquid helium, since even a single penetration of the HTS material by liquid helium could cause destruction thereof. The stable configuration of the chamber in accordance with the invention assures that the chamber is sufficiently well sealed, even in the event of a quench. In this manner, a quench cannot lead to destruction of the expensive HTS material.

The chamber preferably contains helium with a predetermined pressure $p_{He}$, preferentially with $p_{He}$ between 1 mbar and 10 mbar. The helium can then remove heat from at least one HTS section towards the wall of the chamber and thereby to the helium tank.

In a preferred variation of this embodiment, the helium in the chamber has at least 10 percent He-3 and preferentially at least 50 percent, relative to the overall amount. The helium-3 isotope curtails formation of a superfluid helium phase and therefore increases protection for the HTS material.

In an alternative also preferred embodiment the chamber is evacuated in particular to a pressure $p<10^{-1}$ mbar preferentially $p<10^{-2}$ mbar. A vacuum is easy to establish and to maintain.

In an advantageous embodiment, a sorption medium for helium is disposed in the chamber, in particular, activated charcoal. This obviates the need for long-term use of external or transport pumps.

In a particularly preferred additional embodiment of the cryostat in accordance with the invention, the chamber has a heating device, in particular an electrical heater. The heating device can be used to prevent the formation of liquid helium in the chamber in the event of entrance of a larger quantity of helium, in particular, in the event that insufficient pumping power is available.

In an additional preferred embodiment, the cryostat has a room temperature bore in which the measuring volume is located and which is surrounded by the magnet coil system. The room temperature bore facilitates proper location of the sample in the measurement volume with regard to spatial position and variable temperature.

In a particular preferred embodiment of the invention, the magnetic field produced by the magnet coil system in the measurement volume $B_0$>20 T, in particular >23 T. These strong magnetic fields can easily be achieved with the HTS section and the cryostat in accordance with the invention. In contrast thereto, conventional magnet systems that only have LTS-based sections already reach the theoretical limit at these field strengths, having a critical current density which approaches 0.

In a further preferred embodiment, the coil sections of the magnetic coil system are superconducting short circuited (persistent current mode) during operation. In this manner the degree of stability required for NMR or ICR (ion cyclotron resonance) is achieved.

In a further preferred embodiment, the magnetic coil system has a magnetic field $B_0$ homogeneity in the measurement volume and a time stability for the magnetic field $B_0$ that satisfy the requirements for high resolution NMR spectroscopy.

A further embodiment is preferred with which the cryostat has an additional helium tank with a temperature of helium held therein of approximately 4.2 K and which is connected to the (first) helium tank. The liquid helium in the (first) helium tank has a temperature of $T_L$<4 K. The use of two helium tanks permits the LTS section to be operated at a lower temperature, which leads to higher current capability. Moreover, helium evaporates from the cryostat under normal pressure and therefore can also be refilled at normal pressures. This increases the efficiency of the cooling and the operational safety.

Further advantages of the invention can be derived from the description of the drawings. The above-mentioned features and those to be discussed below can be utilized in accordance with the invention individually or collectively in arbitrary combination. The embodiments shown and described are not to be considered exhaustive enumeration, rather have exemplary character only for illustrating the invention.

BRIEF DESCRIPTION OF THE DRAWING

The invention is represented in the drawing and is further explained with reference to embodiments.

DESCRIPTION OF THE PREFERRED EMBODIMENT

Figure 1:
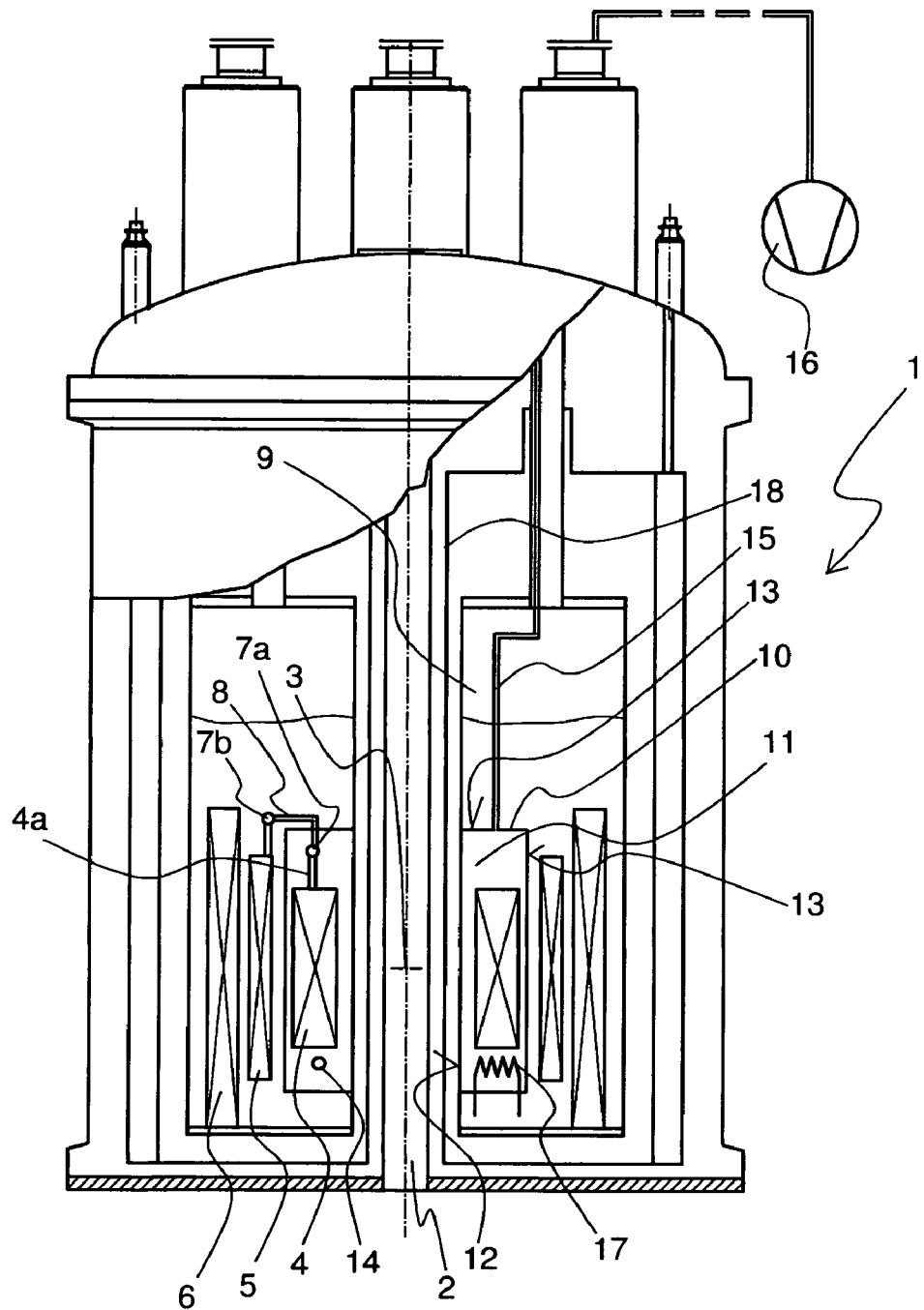
FIG. 1 shows a schematic representation of a first embodiment of a cryostat in accordance with the invention having a helium-sealed container surrounding an HTS section and associated joints.

FIG. 1 shows a first embodiment of a cryostat 1 in accordance with the invention. The cryostat 1 has a room temperature bore 2 in which a measuring volume 3 for a sample is provided. The measuring volume 3 is located in the center of a magnetic coil system, which is formed by three solenoid-shaped coil section 4, 5, 6. The radially innermost coil section 4 has a wounding made from high temperature superconductor (HTS). The middle coil section 5 is wound with $Nb_3Sn$ wire and the outer most coil section 6 is wound with NbTi wire. The coil sections 5, 6 therefore represent low temperature superconductor (LTS) coil sections. The coil sections 4, 5, 6 are electrically connected to each other in series, as is shown in an exemplary fashion by means of superconducting joints 7a and 7b. At joint 7a, the high HTS material of a lead 4a is connected to a HTS coil section 4 by means of an adaptor section 8 made from NbTi. At joint 7b, the adaptor member 8 is connected to the $Nb_3Sn$ wire of the LTS section 5.

The coil sections 4, 5, 6 are located within a helium tank 9 which is substantially filled with liquid helium. The liquid helium in the helium tank 9 has a temperature $T_L$ of less than 4 K, by way of example, approximately 2.0 K. The helium in the helium tank 9 is cooled by a cooling device (not shown) in order to compensate for external heat input and to keep $T_L$ constant. The helium tank 9 is surrounded by a radiation shield 8 for insulation purposes.

The LTS coil sections 5, 6 are directly submerged in the liquid helium. The HTS coil sections 4 as well as the leads 4a and the joint 7a are disposed in a helium-sealed container 10 made from stainless steel The helium-sealed container 10, constitutes a separate chamber 11 within the helium tank 9. The chamber 11 thereby shares a common wall 12 with the helium tank 9 as well as a chamber wall 13 towards the inside of the helium tank 9 and thereby facing the liquid helium. No liquid helium is located within the chamber 11, rather only gaseous helium at a pressure of about 5 mbar. In this manner, one assures that no liquid helium can penetrate into the HTS material of the HTS coil sections 4 or its leads 4a. In consequence thereof, liquid helium cannot evaporate within the HTS material and lead to rupturing thereof by means of the associated rapid volume increase within the HTS material. The chamber 11 preferentially contains helium only.

The chamber 11 is cooled by means of the chamber wall 13. The gaseous helium in the chamber 11 has the same temperature as the liquid helium in the helium tank 9 after establishment of thermal equilibrium, namely $T_L$, and cools the HTS section 4. After thermal equilibrium has been established, the HTS section therefore also has the temperature $T_L$.

The chamber 11 has a pressure-measuring device 14 for monitoring the partial helium pressure. The conduit 15 and a pump device 16 can be used to remove helium from the chamber 11 should the helium pressure in the chamber 11 increase, possibly due to leaks in the chamber wall 13 or in the feed-throughs of a transitional piece 8. In the event that the pumping power of the pumping device 16 is insufficient in order to prevent liquefying of helium in the chamber 11, an additional electrical heater 17 is provided with which the helium in the chamber can be warmed above the boiling temperature. For reasons of clarity, leads to the electrical heater 17 are not shown.

Figure 2:
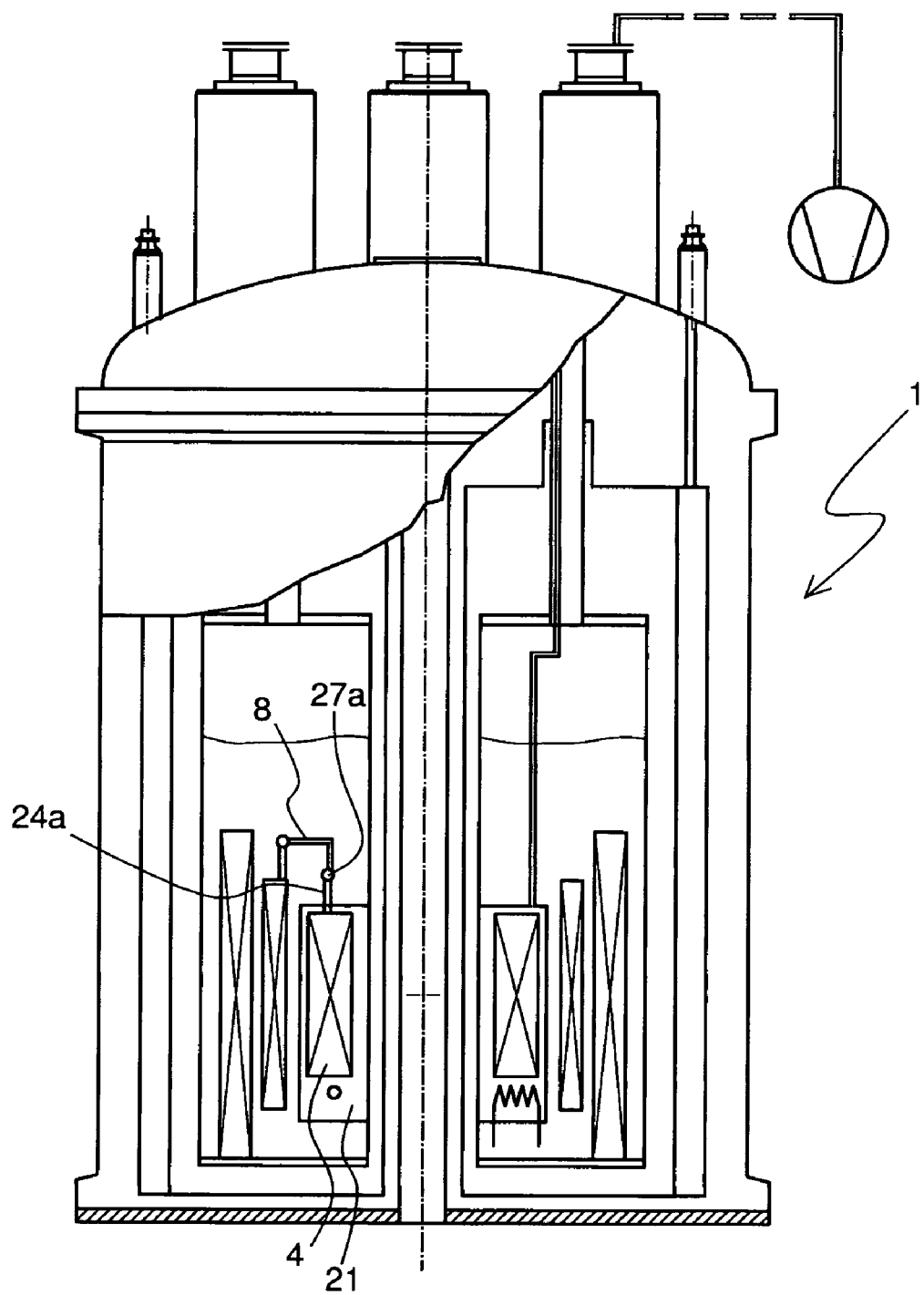
FIG. 2 is a schematic representation of a second embodiment of the cryostat in accordance with the invention having a container which is sealed with respect to helium which surrounds an HTS section with jacketed leads.

The embodiment of a cryostat in accordance with the invention 1 of FIG. 2 substantially corresponds to the cryostat of FIG. 1. However, the cryostat 1 of FIG. 2 has a smaller chamber 21 which is not contain all of the leads 24a made from HTS material and does not contain the joint 27a. The leads 24 and the joint 27a connect the HTS section to the adaptor piece 8. Since the leads 24a can, however, be damaged by liquid helium in the helium tank 9, the leads 24a and the joint 27a are, in this embodiment, surrounded by a helium-sealed device, in particular, made from metal and closed therein and/or are molded within a multi-layer epoxy resin.

Figure 3:
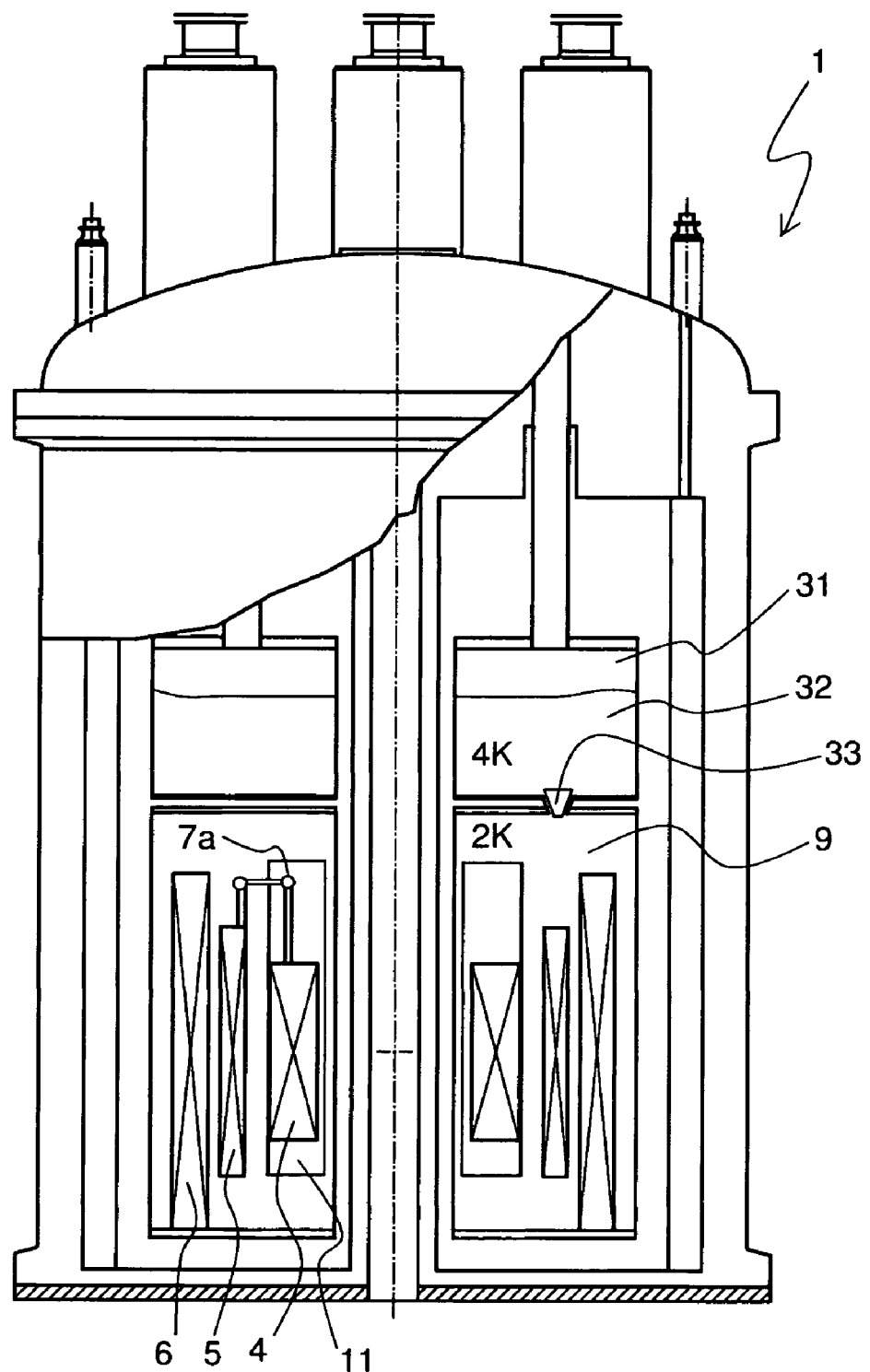
FIG. 3 shows a schematic representation of a third embodiment of a cryostat in accordance with the invention with an additional helium tank.

FIG. 3 shows a third embodiment of a cryostat 1 in accordance with the invention having a lower helium tank 9 and an additional upper helium tank 31. The coil sections 4, 5, 6 of the magnet coil system are located in the lower helium tank 9. The substantially liquid helium disposed therein has a temperature $T_L$ of approximately 2 K. A helium-sealed chamber 11 is disposed within the helium tank 9 and contains the HTS coil section 4. If helium is present in the chamber 11, that helium is gaseous and likewise has a temperature of approximately 2 K. The lower helium tank 9 can be filled by openings (not shown) and can be cooled by a cooling device (also not shown: compare e.g. U.S. Pat. No. 5,220,800). The upper helium tank 31 likewise substantially contains liquid helium 32 but at a temperature of 4 K. The helium pressure in the tanks 9 and 31 is approximately 1 bar. The two helium tanks 9, 31 are separated by a vacuum barrier and connected by means of a safety device, in this particular example, an opening having a safety stopper 33 with a narrow annular gap. U.S. Pat. No. 5,220,800 describes methods for connecting the upper and lower helium tanks 9, 31 which can be utilized in accordance with the instant invention.

The cryostats 1 of FIGS. 1 to 3 are preferentially parts of an NMR apparatus such as an NMR spectrometer or an NMR tomography apparatus, in particular, a high field NMR spectrometer having a magnetic field in the measuring volume $B_0 > 20$ T, preferentially $> 23$ T, wherein the magnetic coil system satisfies the requirements of high resolution NMR spectroscopy with regard to the magnetic field $B_0$ homogeneity in the measuring volume and the temporal stability of $B_0$, which, in general requires that the coil sections of the magnetic coil system be operated in persistent current mode.

We claim:

1. A cryostat and magnet coil system, the magnet coil system having a plurality of radially nested superconducting solenoid-shaped coil sections which are electrically connected in series for production of a magnet field $B_0$ in a measuring volume, the cryostat and magnet coil system comprising:
   a helium tank;
   liquid helium disposed within said helium tank, said liquid helium having a helium temperature $T_L$;
   an LTS section of a conventional low temperature superconductor (LTS) disposed in said helium tank at said helium temperature $T_L$;
   a chamber disposed within said helium tank; gaseous helium disposed in said chamber, said gaseous helium having essentially said helium temperature $T_L$;
   at least one HTS section disposed within said chamber in contact with said gaseous helium, said HTS section having a high temperature superconductor; and
   means, disposed in or communicating with said chamber, for keeping helium located in said chamber in a gaseous state.

2. The cryostat of claim 1, wherein a temperature of the liquid helium $T_L < 4K$, $< 2.5$ K or $< 2.2$ K.

3. The cryostat of claim 1, wherein said chamber also surrounds superconducting leads feeding to at least one HTS section, at least to an extent that said leads contain HTS material.

4. The cryostat of claim 1, wherein said chamber has a pressure-measuring device or a thermothron.

5. The cryostat of claim 1, wherein a conduct connects said chamber to a pump device.

6. The cryostat of claim 1, wherein said chamber is fortified with respect to quenches or said chamber is stable with respect to an external pressure of 5 bar.

7. The cryostat of claim 1, wherein said chamber is structured to contain helium at a previously determined pressure of $p_{He}$ or at a pressure $p_{He}$ between 1 mbar and 10 mbar.

8. The cryostat of claim 7, wherein helium in said chamber is at least 10 percent He-3 or at least 50 percent He-3 relative to an overall amount thereof.

9. The cryostat of claim 1, wherein said chamber is evacuated at a pressure $p<10^{-1}$ mbar or at a pressure $p<10^{-2}$ mbar.

10. The cryostat of claim 9, further comprising sorption medium for helium or activated charcoal disposed in said chamber.

11. The cryostat of claim 1, wherein said chamber has a heating device or an electrical heater.

12. The cryostat of claim 1, wherein the cryostat has a room temperature bore in which the measurement volume is located, the bore being surrounded by the magnet coil system.

13. The cryostat of claim 1, wherein the magnet coil system produces a magnetic field $B_0$ in the measurement volume, which is larger than 20 T or larger than 23 T.

14. The cryostat of claim 1, wherein the coil sections of the magnet coil system are operated in persistent current mode.

15. The cryostat of claim 14, wherein the magnet coil system fulfills requirements of high resolution NMR spectroscopy with regard to homogeneity as well as temporal stability of the magnetic field $B_0$ in the measurement volume.

16. The cryostat of claim 2, further comprising an additional helium tank for liquid helium contained therein at a temperature of approximately 4.2 K.

17. A cryostat and magnet coil system, the magnet coil system having a plurality of radially nested superconducting solenoid-shaped coil sections which are electrically connected in series for production of a magnet field B0 in a measuring volume, the cryostat and magnet coil system comprising:
 a helium tank for holding liquid helium disposed within said helium tank, said liquid helium having a helium temperature TL;
 an LTS section of a conventional low temperature superconductor (LTS) disposed in said helium tank at said helium temperature TL;
 a chamber disposed within said helium tank;
 gaseous helium disposed in said chamber, said gaseous helium having essentially said helium temperature TL;
 at least one HTS section disposed within said chamber and surrounded by said chamber in contact with said gaseous helium, said HTS section having a high temperature superconductor (HTS); and
 means, disposed in or communicating with said chamber, disposed, structured, and dimensioned for sustaining a pressure therein which is sufficiently low as to keep helium located in said chamber in a gaseous state at said temperature TL,
 wherein a temperature of the liquid helium TL<2.2 K, said chamber also surrounding superconducting leads feeding to at least one HTS section, at least to an extent that said leads contain HTS material.

18. The cryostat of claim 17, wherein a conduct connects said chamber to a pump device.

19. The cryostat of claim 18, wherein the coil sections of the magnet coil system are operated in persistent current mode.

20. The cryostat of claim 19, wherein the magnet coil system fulfills requirements of high resolution NMR spectroscopy with regard to homogeneity as well as temporal stability of the magnetic field B0 in the measurement volume.

\* \* \* \* \*